(12) United States Patent
Oono

(10) Patent No.: US 7,898,289 B2
(45) Date of Patent: Mar. 1, 2011

(54) TRANSMISSION CIRCUIT

(75) Inventor: Tsuyoshi Oono, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 12/487,429

(22) Filed: Jun. 18, 2009

(65) Prior Publication Data
US 2009/0315635 A1     Dec. 24, 2009

(30) Foreign Application Priority Data
Jun. 19, 2008   (JP) ............................... 2008-160139

(51) Int. Cl.
*H03K 17/16* (2006.01)
*H03K 19/003* (2006.01)
(52) U.S. Cl. ............................. 326/30; 326/32; 326/33
(58) Field of Classification Search .................... 326/30
See application file for complete search history.

(56) References Cited

U.S. PATENT DOCUMENTS 5,982,192 A * 11/1999 Saito ........................... 326/30
6,097,208 A * 8/2000 Okajima et al. ............... 326/26

FOREIGN PATENT DOCUMENTS

JP           11-45138 A       2/1999

* cited by examiner

*Primary Examiner*—Anh Q Tran
(74) *Attorney, Agent, or Firm*—Foley & Lardner LLP

(57) ABSTRACT

A transmission circuit includes a plurality of transmission lines connected in a ring to propagate signals among a plurality of devices. The plurality of transmission lines have a predetermined same propagation delay, and a predetermined transmission line impedance, and the predetermined transmission line impedance is a half or less of an output impedance of each of the plurality of devices. When a signal outputted from a first optional one of the plurality of devices is propagated to the plurality of devices other than the first optional device, the signal outputted from the first optional device exceeds a predetermined threshold of a signal voltage at a same time.

13 Claims, 14 Drawing Sheets

D:DRIVER    R:RECEIVER

IN CASE THAT OUTPUT OF IC 25 IS LOW LEVEL

IN CASE THAT OUTPUT OF IC 25 IS LOW LEVEL

TRANSMISSION CIRCUIT

INCORPORATION BY REFERENCE

This patent application claims priority on convention based on Japanese Patent Application No 2008-160139. The disclosure thereof is incorporated herein by reference.

BACKGROUND OF THE INVENTION

1. Field of the Invention

The present invention relates to a transmission circuit and a transmission method of using the transmission circuit, and more particularly relates to a transmission circuit to be connected to a plurality of devices and a transmission method of using the transmission circuit.

2. Description of Related Art

In recent years, in association with the rapid advancement of technology, the integration density in an SiP (System in Package) becomes more and more higher. Even in a transmission circuit network system of the SiP device and a device different from the SiP device, the configuration of a higher density and a higher speed operation are advanced.

In a typical transmission circuit network, a tuning of a transmission circuit network is performed for realization of a desirable transmission. For example, the use of a termination resistor, the use of a damping resistor (series termination), the adjustment of a transmission line impedance, the adjustment of a transmission line length, and the like are carried out.

Here, the following limits are caused in the transmission circuit network system in a high density mounting, in such a way that DRAM is installed inside the SiP and further the DRAM is connected on PCB (Printed Circuit Board). That is, an in-SiP transmission line is in the mounting state of a very high density. Thus, there is no margin to perform the tuning, and it is difficult to tune a line serving as a transmission line. Also, a scheme of using the termination resistor leads to the increase in power consumption. Moreover, in case that a plurality of devices are connected and signals are transmitted to and received from each other, the transmission delays cannot be made equal between the plurality of devices. The temporal deviation caused due to this transmission delay results in severe constraint in the high speed transmission.

At first, a typical transmission circuit network having no distortion will be described as a comparison target with reference to FIGS. 1 and 2.

FIG. 1 is a circuit diagram showing a transmission circuit according to a conventional technique. The transmission circuit contains two transmission lines T12 and T13. The two transmission lines T12 and T13 are connected in series. A contact in which the two transmission lines T12 and T13 are connected is referred-to as a connection point N72. One tip of the transmission line T12 is referred to as a connection point N71. The other tip of the transmission line T13 is referred to as a connection point N73. Devices DEV1, DEV2 and DEV3 are connected to the three connection points N71, N72 and N73, respectively.

The two connection points N71 and N73 also serve as the two terminations of the transmission circuit. The two connection points N71 and N73 are connected through two termination resistors RT1 and RT2 to two termination power sources VT1 and VT2, respectively.

As a specific connection, the termination resistor RT1 is firstly connected between the termination power source VT1 and a connection point N71, and the device DEV1 is connected to the connection point N71. The transmission line T12 is connected between the connection point N71 and the connection point N72, and the device DEV2 is connected to the connection point N72. Also, a transmission line T23 is connected between the connection point N72 and the connection point N73, and the device DEV3 is connected to the connection point N73. Then, the termination resistor RT2 is connected between the connection point N73 and the termination power source VT2. Here, each of the devices DEV1, DEV2 and DEV3 is a device having a bidirectional interface that contains a driver and a receiver.

The operations of the transmission circuit in FIG. 1 will be described below. At first, each of the two transmission lines T12 and T23 is assumed to meet that a transmission line impedance is 50Ω and a transmission delay is 250 ps. Each of the resistance values of the two termination resistors RT1 and RT2 is also defined as 50Ω. As for the two termination power sources VT1 and VT2, each of the voltages is defined as 0 V.

In FIG. 1, it is supposed that a signal is outputted from a driver of the device DEV1 and transmitted to a receivers of the devices DEV2, DEV3. The voltage of the signal outputted from the device DEV1 is defined as 1 V. The output impedance is defined as 25Ω that is equal to a half of a transmission line impedance. The rising time of the output signal is defined as 200 ps. A terminal capacitance of the device is defined as 1 pF.

The transmission line viewed from the device DEV1 seems to be in a state that the termination resistor RT1 of 50Ω and the transmission line T12 of 50Ω are connected in parallel. In short, an equivalent impedance of the transmission line when viewed from the device DEV1 seems to be 25Ω. Thus, it results in the state matched to the output impedance of 25Ω.

At the time of the rising time, the output level becomes the level when 1 V is divided by 25Ω of the equivalent impedance of the line and 25Ω of the output impedance of the device DEV1. Then, its value becomes 0.5 V as shown by the following equation (1):

$$1 \times 25/(25+25) = 0.5$$

It is supposed that the signal is transmitted through the transmission line. This signal is transmitted as a state that the transmission lines T12 and T13 are matched to 50Ω, and with the termination of the RT2, it is transmitted in a state that they are matched to 50Ω until the final end. In short, a reflection is not generated except deterioration caused by the terminal capacitances of the devices DEV1, DEV2 and DEV3.

The final DC level is induced from the resistance division between a synthetic resistance of 25Ω in which the termination resistors RT1 and RT2 of 50Ω are connected in parallel and the output impedance 25Ω of the device DEV1. Thus, the final level is 0.5 V.

The properties of the two connection points N72 and N73 in FIG. 1 will be described below. Similarly to the fact that the reflection is not generated in the waveform of the device DEV1, the properties of the two connection points N72 and N73 become the property as the elapse point in the signal transmission. In short, the properties of the two connection points N72 and N73 become the property in which the property of the connection point N71 is transmitted after the temporal elapse corresponding to the transmission delays of the transmission lines T12 and T13. In short, the first level and the final level are equal to 0.5 V. Even in the transmission, the impedance is always matched, and the distortion caused by the reflection is suppressed.

FIG. 2 is a transmission property graph when the transmission circuit in FIG. 1 operates. The horizontal axis indicates time, and its unit is a nano-second (ns). The vertical axis indicates the voltage of the output of the transmission circuit, and its unit is a volt (V).

Three waveforms W3N1, W3N2 and W3N3 correspond to the properties of the three connection points N71, N72 and N73, respectively. Thus, in the bus connection inside an electronic apparatus, it is important to suppress the reflection in the transmission circuit network in order to attain the data transmission of a high speed.

In relation to the foregoing descriptions, Japanese Patent Application Publication (JP-A-Heisei, 11-45138) discloses a technique according to a high speed bus circuit method. In the high speed bus circuit method, a plurality of integrated circuits are connected through resistors to transmission lines, respectively, and the resistors and the transmission lines are connected to be alternately installed, and the entire bus is formed in the shape of one loop. In this related art 1, "it is same to a configuration in which six resistors r12, r23, r34, r45, r56 and r61 are added to a transmission circuit in a second embodiment of the present invention" is described.

Also, "a resistor R25, since acting as the termination resistor, can suppress the reflection. That is, since it can be regarded to have the same potential as a ground and a power source from the viewpoint of AC, it operates as the termination resistor, and the generation of the reflection components can be suppressed" is described in the same specification.

From the foregoing descriptions, the best values of the circuit constants in the respective members are estimated as follows. That is, at first, transmission lines SL21, SL22, SL23, SL24, SL25 and SL26 have their transmission line impedances of 50Ω, and their transmission delays are 250 ps, Also, the resistance values of resistors R21, R22, R23, R24, R25 and R26 are equally 50Ω.

Here, it is assumed that a signal is outputted from a driver of a device IC25 and transmitted to devices IC21, IC22, IC23, IC24 and IC26. At this time, the output signal outputted from the device IC25 is assumed to have the voltage of 1 V. Also, the output impedance is assumed to be 50Ω. Moreover, the rising time of the output signal is assumed to be 200 ps, and the terminal capacitance of the device is assumed to be 1 pF.

At first, the waveform of a connection point N95 in FIG. 2 will be described. The transmission line viewed from the device IC25 seems to be in a situation that an anticlockwise path and a clockwise path are connected in parallel. Here, an anticlockwise path is a path oriented in the direction of the transmission line SL24 and the resistor R24. Also, the clockwise path is the path oriented in the direction of the resistor R25 and the transmission line SL25.

From the viewpoint of the device IC25, the two paths of the equivalent impedances when they are viewed from the device IC25 differ from each other. At first, the anticlockwise path oriented in the direction of the transmission line SL24 and the resistor R24, since the transmission line is forwardly located, it seems to be equivalently 50Ω. On the other hand, the clockwise path oriented in the direction of the resistor P,25 and the transmission line SL25 seems to be equivalently 100Ω since the resistor is forwardly located.

Thus, the synthetic equivalent impedance when they are viewed from the device IC21 is about 33.3Ω as represented by the following equation (2).

$$(50 \times 100)/(50+100)=33.3$$

Thus, the output level is a level obtained by dividing 1 V by using 33.3Ω of the equivalent impedance of the line and 50Ω of the output impedance of the IC21. Its value is 0.4 V as represented by the following equation (3):

$$1 \times R/(50+R)=0.4$$

Here, $$R=(50 \times 100)/(50+100)$$

The changes in the respective connection points with regard to a signal voltage transmitted through the transmission lines are sequentially determined when the signal of 0.4 V is transmitted through the clockwise path and anticlockwise path in the transmission lines connected in the shape of a ring. In the transmission, the equivalent impedance of each connection point is 50Ω when "the transmission line is forwardly located and the resistor is backwardly located" and 100Ω when "the resistor is forwardly located and the transmission line is backwardly located". This difference namely results in a mismatching. Thus, the transmission of the-signal causes the reflection and the attenuation to be repeatedly generated for each connection point. Moreover, the transmission lines are connected in the shape of the ring. Thus, with the overlapping with the reversely circulating signal, the property is also changed in correspondence to this overlapping.

The transmission circuit is ring-shaped, and it is not terminated. Thus, the final DC level is 1 V that is equal to an input signal. However, "the clockwise signal" and "the anticlockwise signal" and "the multiplex reflection" generated by the mismatching of each of the connection points are overlapped. Accordingly, as the result of the increase in the voltage, the 1 V is finally induced.

In the transmission circuit according to the related art 1, as the property of the connection point N95, the waveform of W4N5 in FIG. 4 is obtained. Similarly, waveforms W4N1, W4N2, W4N3, W4N4 and W4N6 in FIG. 4 correspond to the properties of connection points N91, N92, N93, N94 and N96, respectively. As evident from those waveforms, the distortion of the waveform caused due to the reflection signal is not suppressed. In addition, in the conventional technique, the transmission delays cannot be made equal. Thus, in the high speed transmission, the deviation between the transmission delays results in the severe constraint.

The technique disclosed in the related art 1 will be described below in further detail, in accordance with FIGS. 3 to 7. FIG. 3 is a circuit diagram of the transmission circuit in the conventional technique of the related art 1. Each of the ICs 21 to 26 is an IC that a driver and a receiver are built in. The SL21 to SL26 are the transmission lines on the printed circuit board through which the signal on the bus is transmitted. The R21 to R26 are the resistors.

The operation of the basic circuit in the conventional technique will be described below. At first, in the transmission of the data through the bus, the bus is driven by various integrated circuits (hereafter, referred to as ICs) that include a processor in which the driver and the receiver in any one of the ICs 21 to 26 connected to the bus is built in. The operations when the signal appearing in the bus at that time is received by the other IC are similar to the operations of the conventional example in FIG. 1. Also, all the receivers in the related art 1 are high in input impedance and are lightly affected with regard to the signal transmission, similarly to the conventional example. Thus, the waveform distortion in this portion is assumed to be able to be ignored.

FIG. 4 is a transmission property graph showing the transmission circuit in the related art 1. The feature in this transmission property graph lies in a design that the bus is loop-shaped and the respective resistors are inserted in series between the transmission lines through which the respective ICs are connected and one sides of the resistors are directly connected to the respective drivers and receivers without passing through the transmission lines. For example, a case in which the IC25 drives the bus and sends the signal is shown in FIG. 5 when the circuit is equivalently rewritten.

FIG. 5 is a circuit diagram showing the operation of the transmission circuit in the related art 1. In this circuit diagram, at the moment when the driver of the IC25 drives the bus, the left end of the transmission line SL24 located closest to the output and the left end of the transmission line SL25 through the resistor R25 serve as a load. Then, the anticlockwise signal transmission route whose start point is the left end of the transmission line SL24, as indicated by the dotted line arrow in FIG. 5, and the clockwise signal transmission route whose start point is the resistor R25 in the direction opposite to the dotted line arrow are configured. When the anticlockwise signal transmission route shown in FIG. 5 is further rewritten, the equivalent circuit shown in FIG. 6 is obtained.

FIGS. 6A and 6B are equivalent circuit diagrams corresponding to the transmission circuit in the related art 1. In this equivalent circuit diagram, the driver of the IC25 firstly drives the left end of the transmission line SL24. Then, the signal transmitted through the SL24 next arrives at the transmission line SL23 through the resistor R24. Moreover, the signal is transmitted in an order of the resistor R23, the transmission line SL22, the resistor R22, the transmission line SL21, the resistor R21, the transmission line SL26, the resistor R26, the transmission lines SL25 and R25. At the resistor R25, the element connected to the side opposite to the transmission line SL25 is the output of the signal source IC25 in FIG. 5.

However, in FIGS. 6A and 6B, a case when the output of the IC25 is "L" is equivalently indicated by a circuit 3 in FIG. 6A, and a case when the output of the IC25 is "H" is equivalently indicated by a circuit 4 in FIG. 6B. That is, when the output of the IC25 is "L", the termination resistor R25 can be considered to be connected through a small impedance r to the ground. Also, when the output of the IC25 is "H", it can be considered to be connected through the small impedance r to a voltage level VH at the time of the "H". Thus, since the resistor R25 is terminated at the same voltage level as the output of the signal source IC25, the wasteful consumption current does not flow. Then, when the output impedance r of the IC25 is made sufficiently small, the resistor R25 acts as a termination resistor, and the reflection can be suppressed. That is, it can be regarded to have the same potentials as the ground and the power source in the AC manner. Therefore, it acts as the termination resistor, and the generation of the reflection component is suppressed. On the other hand, when the clockwise signal transmission line opposite to the dotted line arrow in FIG. 5 is further rewritten as the equivalent circuit, the circuit shown in FIG. 7 is obtained.

FIG. 7 is an equivalent circuit diagram corresponding to the transmission circuit in the related art 1. As evident from this equivalent circuit diagram, the resistor R25 connected to the output of the driver of the IC25 operates to decrease the reflection by acting as the transmission end resistor when the transmission line SL25 is driven. It should be noted that all of the resistors R21 to R26 inside this high speed bus have the same voltage level in the DC manner. Thus, the wasteful consumption current does not flow.

In order to attain the high speed data transmission in the bus connection inside the electronic apparatus, it is important to suppress reflections in the transmission circuit network. The technique disclosed in the related art 1 describes that as mentioned above, the reflection is suppressed and further the typical termination resistor is not used, which attains the suppression in the DC power.

However, in the technique of the related art 1, the reflection cannot be suppressed contrarily to the description. In the specific example in the technique of the related art 1, its property indicates the waveform shown in FIG. 4. A number of shelves caused by the multiple reflections are generated near a logical threshold. Thus, far from suppressing the reflection, actually, there is the large number of multiple reflections.

SUMMARY

In an aspect of the present invention, a transmission circuit includes: a plurality of transmission lines connected in a ring to propagate signals among a plurality of devices. The plurality of transmission lines have a predetermined same propagation delay, and a predetermined transmission line impedance, and the predetermined transmission line impedance is a half or less of an output impedance of each of the plurality of devices. When a signal outputted from a first optional one of the plurality of devices is propagated to the plurality of devices other than the first optional device, the signal outputted from the first optional device exceeds a predetermined threshold of a signal voltage at a same time.

In another aspect of the present invention, a transmission method is provided in a transmission circuit which includes a plurality of transmission lines connected in a ring to propagate signals among a plurality of devices. The method is achieved by sending a signal from a first optional one of the plurality of devices to the transmission circuit; by propagating the signal in the transmission circuit; and by supplying the signal to the plurality of devices other than the first optional device. The supplying is achieved by making the signal outputted from the first optional device exceed a predetermined threshold of a signal voltage at a same time in the plurality of devices other than the first optional device.

The transmission circuit of the present invention contains a plurality of transmission lines connected in the shape of a ring. The transmission circuit of the present invention is operated as a bus through which a plurality of devices are connected, because semiconductor integrated circuits are connected at connection points between the respective transmission lines.

In the transmission circuit of the present invention, all of the impedances of the respective transmission lines are set equal. Also, the output impedance of the driver that is driven in the device connected to the transmission circuit of the present invention is set to a half of the impedance of each transmission line. Moreover, the temporal difference of a signal transmission delay between the anticlockwise and clockwise paths in the ring-shaped transmission circuit is set equal to or smaller than a rising time and a falling time of an output signal from the driven driver.

As a result, the transmission circuit of the present invention attains the following features. That is, in a receiving side device, the great reflection is not generated which allows a logical value to be inverted near a logical threshold. It should be noted that even if such a great reflection is generated, it is generated only in a transmitting side device. Thus, there is no problem. Also, all of the receiving side devices can receive the signal at the same timing. Moreover, since the transmission circuit of the present invention does not require the termination resistor, the DC power is also suppressed.

BRIEF DESCRIPTION OF THE DRAWINGS

The above and other objects, advantages and features of the present invention will be more apparent from the following description of certain embodiments taken in conjunction with the accompanying drawings, in which.

DESCRIPTION OF THE PREFERRED EMBODIMENTS

Hereinafter, a transmission circuit according to the present invention will be described in detail with reference to the attached drawings.

First Embodiment

Figure 8:
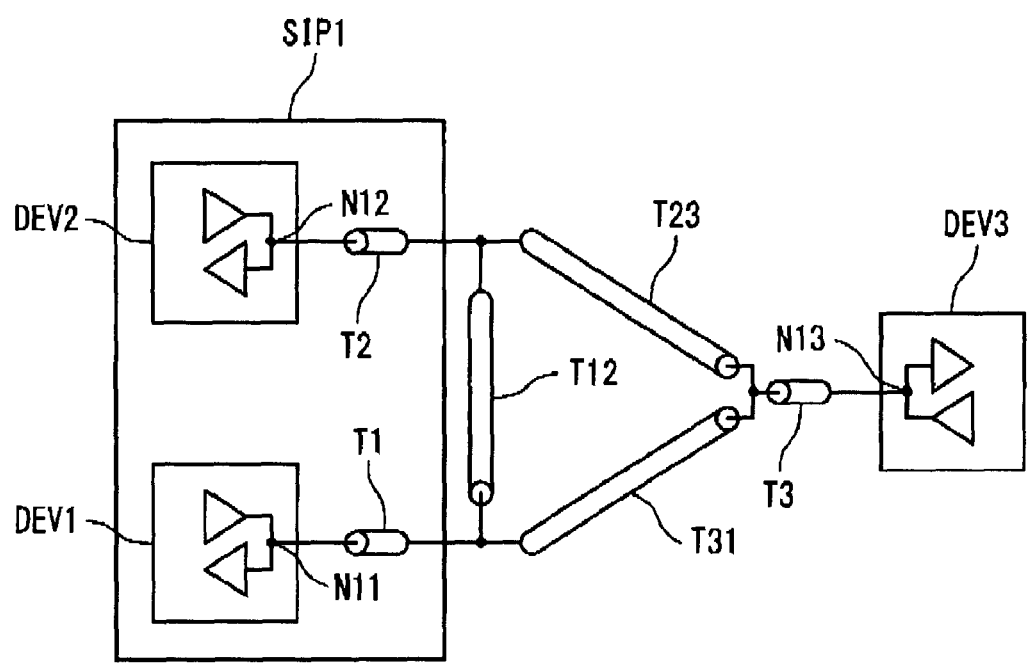
FIG. 8 is a circuit diagram showing a transmission circuit according to a first embodiment of the present invention.

FIG. 8 is a circuit diagram showing a transmission circuit according to a first embodiment of the present invention. The transmission circuit contains six transmission lines T12 and T23, T31, T1, T2 and T3. One of ends of the transmission line T12 is connected to one of ends of the transmission line T23 and one of ends of the transmission line T2. The other of the ends of the transmission line T23 is connected to one of ends of the transmission line T31 and one of ends of the transmission line T3. The other of the ends of the transmission line T31 is connected to the other one of the ends of the transmission line T12 and one of ends of the transmission line T1. The other of the ends of the transmission line T1 is referred to as a connection node N11. A first device DEV1 is connected to the connection node N11. Similarly, the other one of the ends of the transmission line T2 is referred to as a connection node N12. A second device DEV2 is connected to the connection node N12. Similarly, the other one of the ends of the transmission line T3 is referred to as a connection node N13. A third device DEV3 is connected to the connection node N13.

Each of the first to third devices DEV1, DEV2 and DEV3 is a semiconductor integrated circuit that contains a driver for outputting a signal and a receiver for receiving a signal. However, the configuration is not always related to the essential matter of the present invention. The existence of the device that does not contain the driver or receiver is allowable. In this way, the three transmission lines T12 and T23 and T31 configure a ring-shaped bus for the connection between the three devices.

In this example, the first device DEV1, the second device DEV2 and the two transmission lines T1 and T2 are installed in the same SiP package SIP1. However, this configuration has no relation to the essential matter of the present invention, and the present invention is not limited to this configuration.

In the three transmission lines T12, T23, and T31, the transmission line impedances are equal to each other, and the transmission delays are also equal to each other. In each of the three devices DEV1, DEV2 and DEV3, the output impedance of the driver is equal to a half of the transmission line impedance of a corresponding one of the three transmission lines T12 and T23 and T31.

The operation of this transmission circuit will be described below. Here, it is supposed that the driver of the first device DEV1 outputs a signal and this signal is transmitted to the second device DEV2 and the third device DEV3.

It should be noted that since the transmission circuit is ring-shaped, a direction in which the signal is rotated is defined. That is, the direction in which the signal is transmitted in an order from the first device DEV1 to the second device DEV2 and to the third device DEV3 is referred to as a clockwise direction. Similarly, a direction in which the signal is transmitted in an order from the first device DEV1, to the third device DEV3 and to the second device DEV2 is referred to as an anticlockwise direction.

Also, an example of the property in the transmission circuit is defined as follows. In each of the three transmission lines T12, T23 and T31, the transmission line impedance is defined as 50Ω, and the transmission delay is defined as 250 ps. In each of the three transmission lines T1, T2 and T3, the transmission line impedance is defined as 50Ω, and the transmission delay is defined as 20 ps. In each of the three devices DEV1, DEV2 and DEV3, the output impedance of the driver is defined as 25Ω, and the rising time and the falling time of the signal of the driver are defined as 250 ps, and a terminal capacitance of the device is defined as 1 pF.

Figure 9:
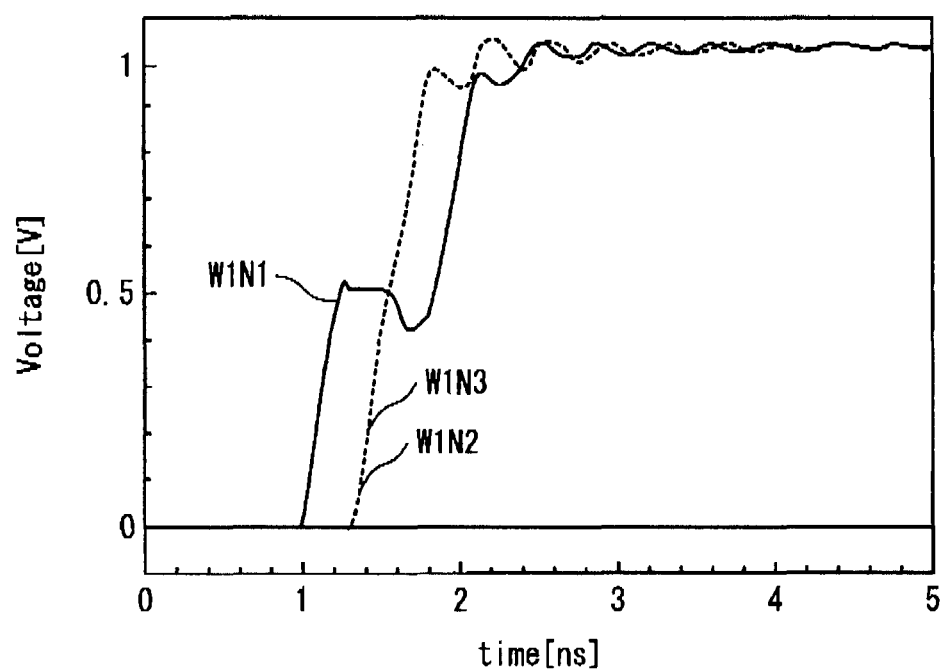
FIG. 9 is a transmission property graph of a connection point N11 of the transmission circuit according to the first embodiment of the present invention.

FIG. 9 is a transmission property graph of the connection node N11 in the transmission circuit according to the first embodiment of the present invention. The transmission property graph indicates three waveforms. The horizontal axis indicates time, and its unit is represented as a nano-second. The vertical axis indicates signal voltage of each waveform, and its unit is represented by a volt.

At the connection node N11, each of the two transmission lines T12 and T31 connected through the transmission line T1 has the transmission line impedances of 50Ω. When they are viewed from the transmission line T1, the two transmission lines T12 and T31 are connected in parallel. Thus, when they are viewed from the transmission line T1, the equivalent impedance of the two transmission lines T12 and T31 is 25Ω.

Although this equivalent impedance is 25Ω, the output impedance of the first device DEV1 is equally 25Ω. Thus, the output level when the signal rises from the driver is 0.5 V in which 1 V is divided by resistors.

It should be noted that although the transmission route is matched to 25Ω, only the transmission line T1 is set to 50Ω. This reason will be described below. At the first output level, the level higher by 20 ps resulting from the transmission delay of the transmission line T1 is desired to be outputted. However, there is a drop in the transmission line impedance caused due to the terminal capacitance of the first device DEV1.

Also, when it is viewed from the ring-shaped transmission line composed of the three transmission lines T12, T23 and T31, the transmission line T1 seems to be branched. For this reason, the transmission line T1 is equivalently regarded as a parasitic capacitance. Since the transmission line T1 seems to be the parasitic capacitance, the signal is deteriorated. In order to suppress this deterioration, the transmission line impedance of the transmission line T1 is desired to be higher than 25Ω.

Figure 10:
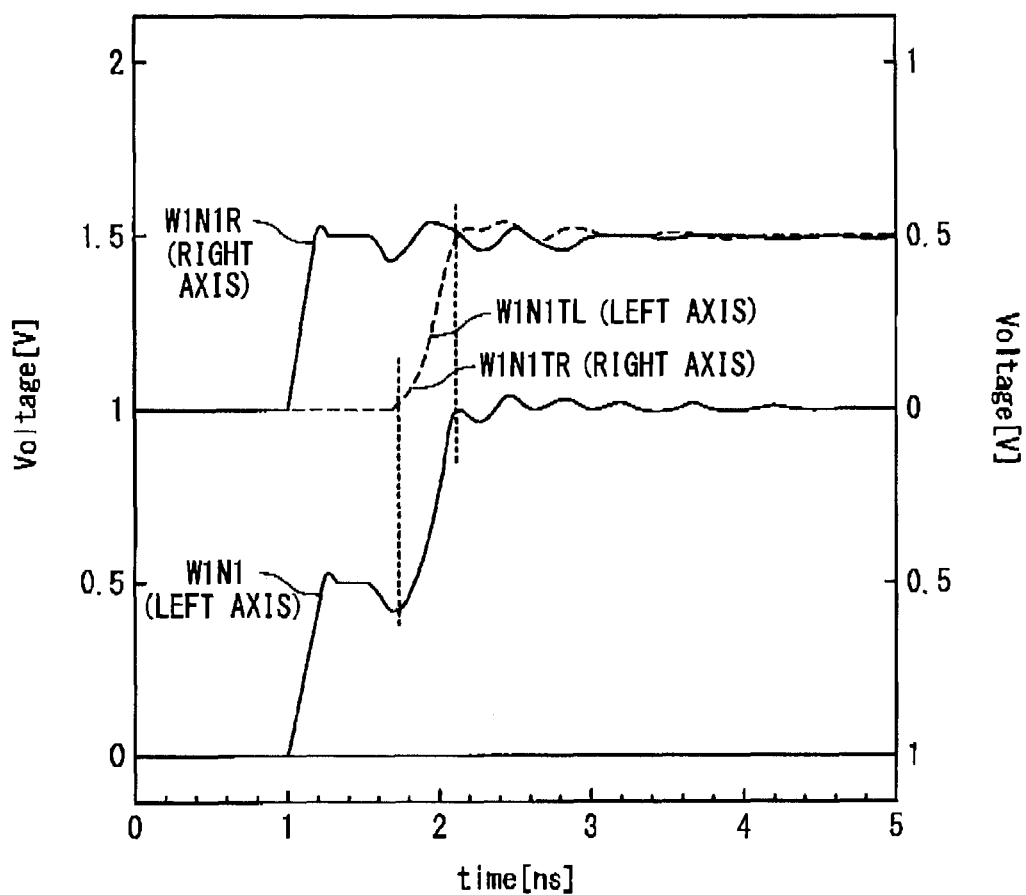
FIG. 10 is a detailed transmission property graph showing a property of the connection point N11 of the transmission circuit according to the first embodiment of the present invention.

FIG. 10 is a detailed transmission property graph showing the property of the connection node N11 in the transmission circuit according to the first embodiment of the present invention. The transmission property graph shows four waveforms. The horizontal axis indicates time. The vertical axis indicates signal voltage of each of the waveforms. However, the two vertical axes are used in order to improve the visibility of the four waveforms overlapping with each other. That is, the left vertical axis corresponds to the first waveform W1N1, and the right vertical axis corresponds to the second to fourth waveforms W1N1R, W1N1TL and W1N1TR, respectively. It should be noted that the right vertical axis is shifted upward by 1 V from the left vertical axis. However, the scales of the left and right vertical axes are equal.

The waveform W1N1 in FIG. 10 is perfectly equal to the waveform W1N1 in FIG. 9. This waveform W1N1 can be disassembled into "a reflection wave", "a clockwise direction waveform" and "an anticlockwise direction waveform". Here, the waveform W1N1R corresponds to a reflection wave, the waveform W1N1TR corresponds to the clockwise direction waveform, and the waveform W1N1TL corresponds to the anticlockwise direction waveform, respectively.

At first, a first signal level of the reflection wave W1N1R is 0.5 V as mentioned above. Next, the reflection wave W1N1R is divided and transmitted through the transmission line T12 and the transmission line T31. When the reflection wave W1N1R is transmitted in the clockwise direction, the transmission line T2 and the second device DEV2 seem to be branched and equivalently seem to be the parasitic capacitances. Similarly, when the reflection wave W1N1R is transmitted in the anticlockwise direction, the transmission line T3 and the third device DEV3 seem to be branched and equivalently seem to be the parasitic capacitance. In both of the cases, the equivalent impedances are dropped. Specifically, the drop from 0.5 V appears after 500 ps equal to two times the transmission delay of the two transmission lines T12 and T31, as the depression in the waveform of the reflection wave.

Next, the clockwise direction waveform W1N1TR and the anticlockwise direction waveform W1N1TL circulate the ring-shaped transmission circuit network. As a result, the waveform similar to the waveform of the reflection wave W1N1R that is observed at the connection node N11 is observed after 750 ps. In short, the two waves W1N1TR and W1N1TL have the waveforms perfectly equal to each other.

After 750 ps, the clockwise direction waveform W1N1TR and the anticlockwise direction waveform W1N1TL are overlapped with the reflection wave W1N1R (all are added) so as to form W1N1. As a result, the waveform of the W1N1 is increased from 0.5 V to the level close to the full-swing, after 750 ps.

Figure 11:
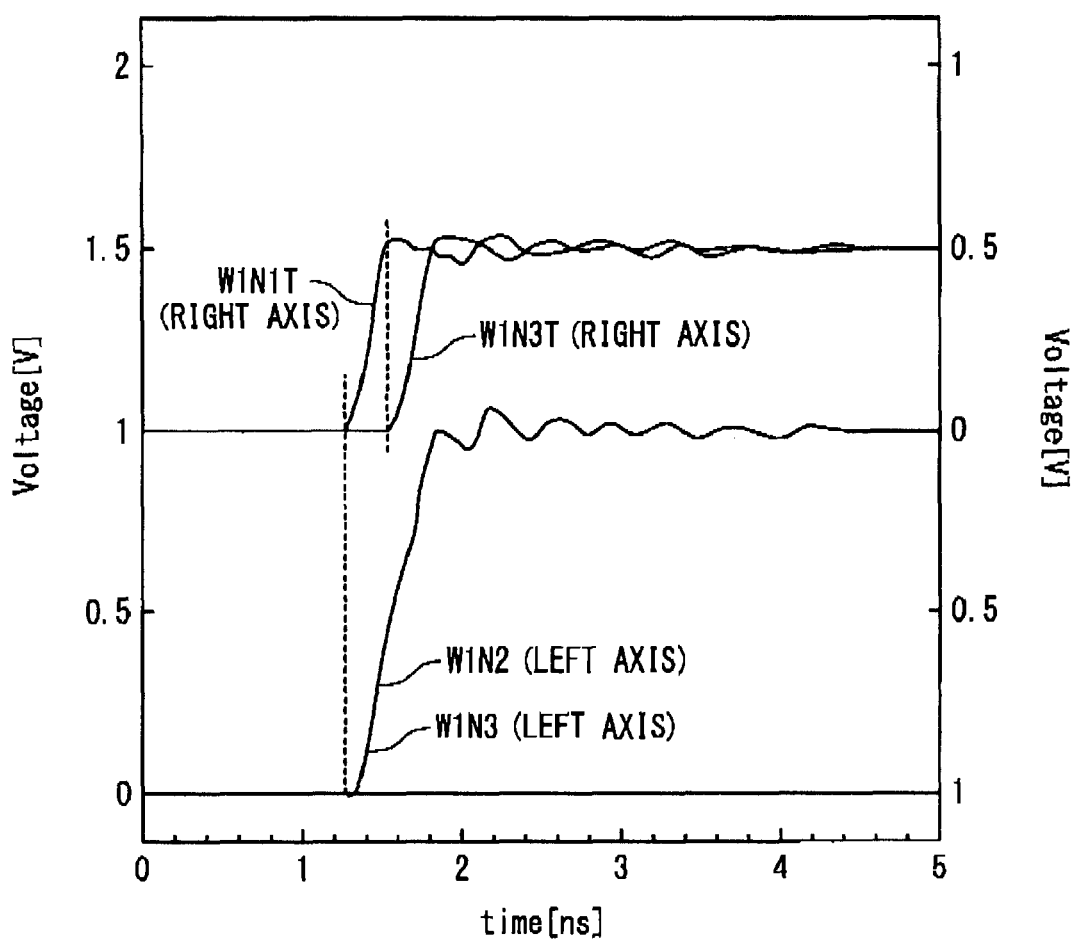
FIG. 11 is a detailed transmission property graph showing temporal changes in signals of two connection points N12 and N13 of the transmission circuit according to the first embodiment of the present invention.

FIG. 11 is a detailed transmission property graph showing the temporal changes in the signals at the two connection nodes N12 and N13 in the transmission circuit according to the first embodiment of the present invention. In other words, FIG. 11 is the waveform diagram showing how the signals are overlapped at the two connection nodes N12 and N13, after the signals are transmitted in the clockwise and anticlockwise directions in the ring-shaped transmission circuit shown in FIG. 8.

This waveform diagram shows the four waveforms. The horizontal axis indicates time. The vertical axis indicates signal voltage of each of the waveforms. However, the two vertical axes are used in order to improve the visibility of the four waveforms overlapping with each other. That is, the left vertical axis corresponds to the first and second waveforms W1N2 and W1N3, and the right vertical axis corresponds to the third and fourth waveforms W1N2T and W1N3T, respectively. It should be noted that the right vertical axis is shifted upward by 1 V from the left vertical axis. However, the scales of the left and right vertical axes are equal.

The waveforms W1N2 and W1N3 indicate the properties of the connection node N12 and the connection node N13, respectively. It should be noted that the two waveforms W1N2 and W1N3 in FIG. 11 are equal to the two waveforms W1N2 and W1N3 in FIG. 9, respectively. The waveform W1N2 can be disassembled into the "clockwise direction waveform" and the "anticlockwise direction waveform" at the connection node N12. Here, the clockwise direction waveform corresponds to the waveform W1N2T, and the anticlockwise direction waveform corresponds to the waveform W1N3T.

Similarly, even if the waveform W1N3 is disassembled into the "clockwise direction waveform" and the "anticlockwise direction waveform" at the connection node N13, two waveforms are obtained. However, these two waveforms are equal to the two waveforms W1N2T and W1N3T, respectively. This is because the transmission circuit is ring-shaped, and when it is viewed from the connection node N11 from which the signal is outputted, the connection nodes N12 and N13 are symmetrical. Thus, the former of the properties of the connection nodes N12 and N13 is selected as the representative, and the description is continued.

At first, the clockwise direction waveform W1N3T at the connection node N12 is in such a manner that the waveform W1N1R shown in FIG. 10 is transmitted from the connection node N11 through the three transmission lines T1, T12 and T2. Thus, the same waveform as the waveform W1N1R is obtained which is shifted by 290 ps that is a total of the transmission line delays of all of the transmission lines through which it travels. It should be noted that 290 ps is a total of 20 ps of the transmission line T1, 250 ps or the transmission line T12 and 20 ps of the transmission line T2.

Next, the anticlockwise direction waveform W1N2T at the connection node N12 is in such a manner that the waveform W1N1R in FIG. 10 is transmitted from the connection node N11 through the four transmission lines T1, T31, T23 and T2. Thus, the same waveform as the waveform W1N1R is obtained which is shifted by 540 ps that is a total of the transmission line delays of all of the transmission lines through which the signal is passed. It should be noted that 540 ps is a total of 20 ps of the transmission line T1, 250 ps of the transmission line T31, 250 ps of the transmission line T23 and 20 ps of the transmission line T2.

As mentioned above, the clockwise direction waveform W1N3T rises 290 ps after the waveform W1N1R. Also, the anticlockwise direction waveform W1N2T rises in the delay of 540 ps from the waveform W1N1R. The waveform W1N3T and the waveform W1N2T are overlapped, namely, all are added, to form the waveform W1N2.

Here, when the W1N2T ends the rising, the W1N3T begins to rise. Thus, the overlapped waveform W1N2 is increased from 0 V to the level close to the full-swing.

Again, the specific numerals are used to re-describe the previous facts. After 250 ps from the output of the signal, the clockwise direction waveform W1N2T ends the rising. The temporal difference between the synthesized clockwise direction waveform W1N2T and the anticlockwise direction waveform W1N2T is a difference between the clockwise and anticlockwise transmission delays, and it is 250 ps. Here, 250 ps is the difference between 540 ps and 290 ps. In short, the rising time of the waveform and the transmission delay of T23 are equal. As a result, the rising of the clockwise direction waveform W1N2T and the rising of the anticlockwise direction waveform W1N2T are continuous and the waveform of the waveform W1N2 is obtained.

The description of the property of the connection node N12 is added to the relation between the "rising time of the waveform" in the overlapping and the "temporal difference between the clockwise transmission delay and the anticlockwise transmission delay".

At first, a case that "the rising time of the waveform" is 250 ps and "the temporal difference between the clockwise direction waveform and the anticlockwise direction waveform" is 300 ps will be described. That is, the case that "the temporal difference between the clockwise direction waveform and the anticlockwise direction waveform" is longer than "the rising time of the waveform" will be described.

After the clockwise direction waveform W1N2T finishes the rising at 250 ps, the anticlockwise direction waveform W1N2T does not rise until 300 ps of the temporal difference between the clockwise direction waveform and the anticlockwise direction waveform. In the period of 50 ps that is the interval between them, the signal voltage stays near 0.5 V. In short, a shelf is generated near 0.5 V of a logical threshold. This implies the increase in a risk that the logic is erroneously inverted.

Next, a case that "the rising time of the waveform" is 250 ps and "the temporal difference between the clockwise transmission delay and the anticlockwise transmission delay" is 200 ps will be described. That is, the case that "the temporal difference between the clockwise transmission delay and the anticlockwise transmission delay" is shorter than "the rising time of the waveform" will be described.

At the time of 200 ps after the temporal difference between the clockwise direction waveform and the anticlockwise direction waveform before the clockwise direction waveform W1N2T ends the rising at 250 ps, the anticlockwise direction waveform W1N2T rises. Between 50 ps in which they are overlapped, the added change is induced, which doubles the inclination when the waveform rises. In short, the rising is sharper near the logical threshold. Thus, there is no fear that the logic is inverted.

Depending on the property of the connection node N12, the relation between "the rising time of the waveform" and "the temporal difference between the clockwise transmission delay and the anticlockwise transmission delay" in the overlapping is repeated. When "the temporal difference between the clockwise transmission delay and the anticlockwise transmission delay" is longer than "the rising time of the waveform", the shelf is generated. When "the temporal difference between the clockwise transmission delay and the anticlockwise transmission delay" is shorter than "the rising time of the waveform", the shelf is not generated. Since the shelf is generated near the logical threshold, there is a risk that the logic is inverted. However, there is no problem in case of the level at which the logic is not inverted due to a degree of a skew that is not the degree of the shelf.

As mentioned above, as the reasons why the problems of the known techniques are solved by the first embodiment of the present invention, roughly, there are the following three reasons. At first, since the resistor is removed from the ring-shaped transmission circuit, the multiple reflections are suppressed. Also, the condition to solve the problem is discovered in the transmission impedance of the ring-shaped transmission circuit and the output impedance of the driver. Moreover, the condition to solve the problem is discovered in the relation between "the rising/falling time of the Waveform" and "the temporal difference between the clockwise transmission delay and the anticlockwise transmission delay".

Figure 5:
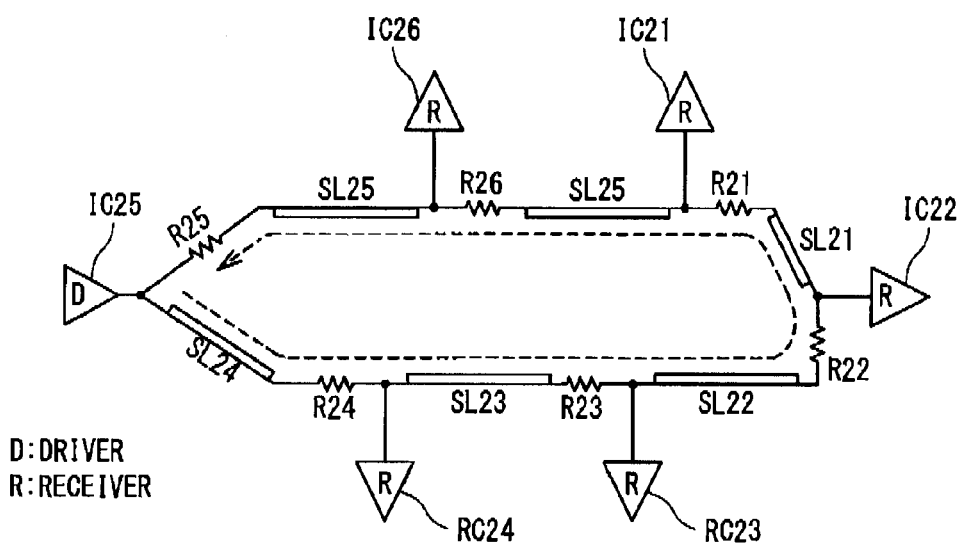
FIG. 5 is a circuit diagram showing an operation of the transmission circuit in the related art 1.
Figure 6A:
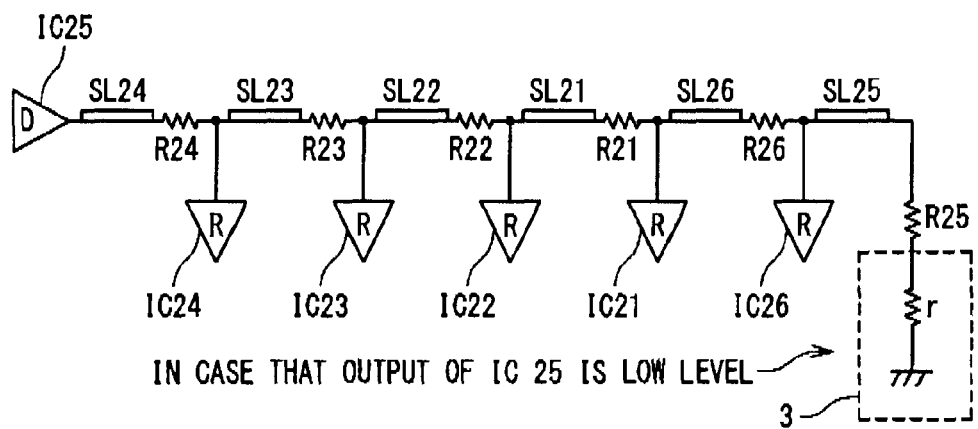
FIGS. 6A and 6B are equivalent circuit diagrams corresponding to the transmission circuit in the related art 1.
Figure 6B:
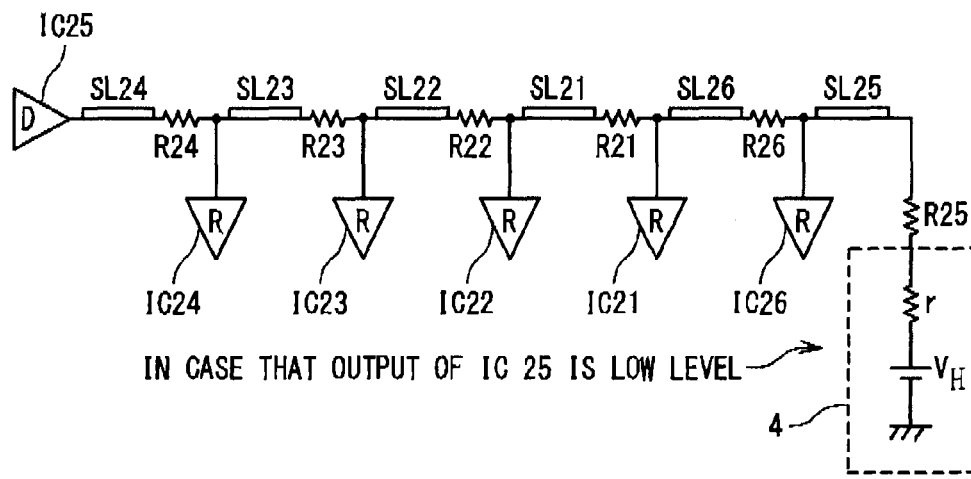
Figure 7:
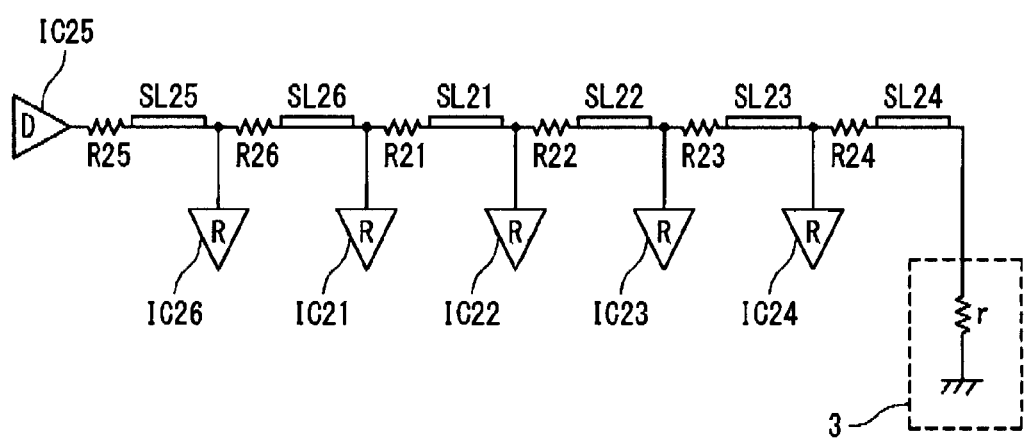
FIG. 7 is an equivalent circuit diagram corresponding to the transmission circuit in the related art 1.

Firstly, the design of removing the resistor from the ring-shaped transmission circuit and suppressing the multiple reflections will be described below. In the conventional technique, when they are viewed from the connection node device DEV5 shown in FIG. 5, the two paths are different in the equivalent impedance viewed from the device DEV5. The anticlockwise path oriented in the direction of a transmission line T45 and a resistor R45 seems to be 50Ω equivalently, because the transmission line is forwardly located. On the other hand, the clockwise path oriented in the direction of a resistor R56 and a transmission line T56 seems to be 100Ω equivalently, because the resistor is forwardly located.

In short, in the transmission, the equivalent impedance of each connection node is different in such a way that a case that "the transmission line is forwardly located and the resistor is backwardly located" is 50Ω and a case that "the resistor is forwardly located and the transmission line is backwardly located" is 100Ω. Thus, since the difference results in the mismatching, the signal is transferred while the reflection and the attenuation are repeatedly, for each connection node.

On the other hand, in the first embodiment of the present invention, in the transmission circuit network connected in the shape of the ring by the transmission lines T12 and T23 and T31 as shown in FIG. 8, all the transmission lines are matched to 50Ω in the transmission. In short, in the first embodiment of the present invention, the state in which the matching is attained is configured, which can suppress the multiple reflection caused by the mismatching.

Figure 1:
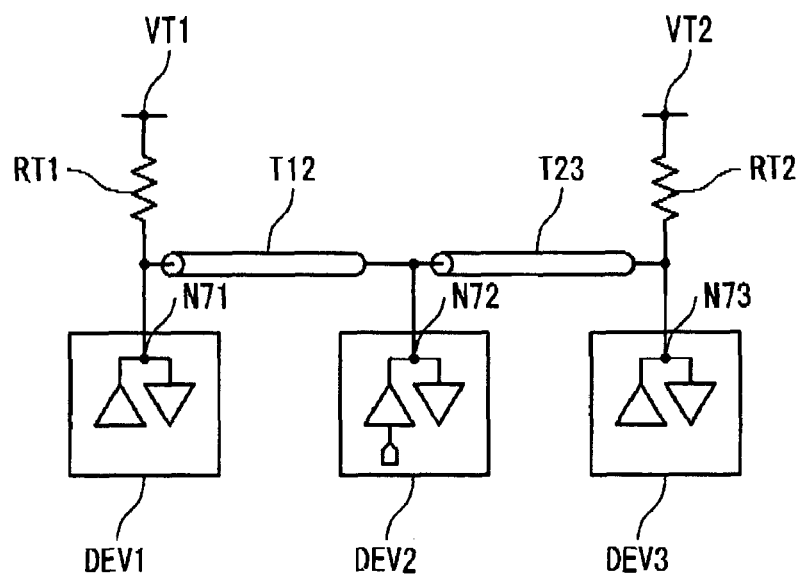
FIG. 1 is a circuit diagram showing a transmission circuit in a conventional technique.
Figure 2:
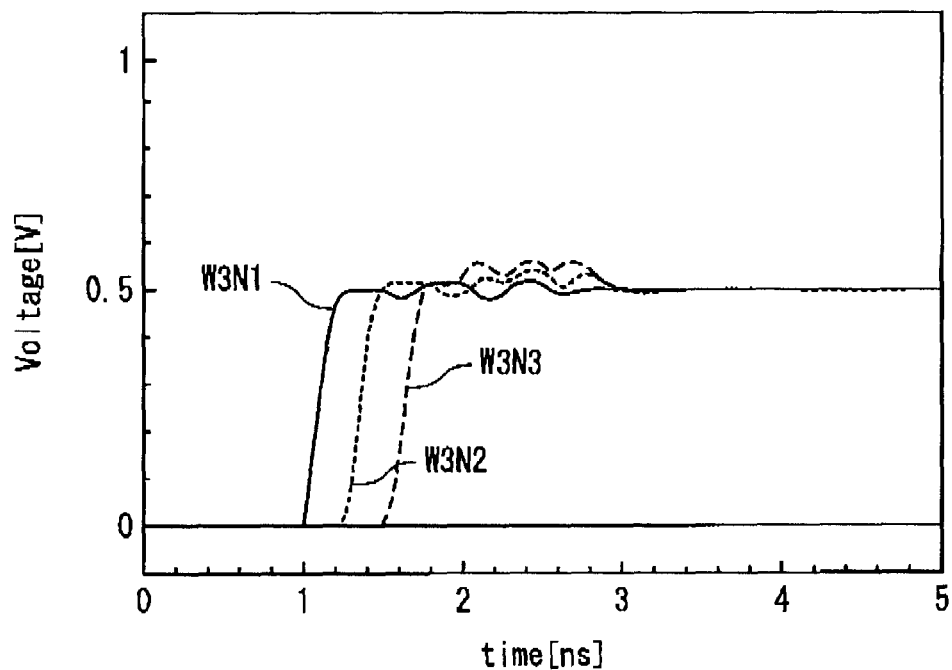
FIG. 2 is a transmission property graph when the transmission circuit in the conventional technique operates.
Figure 3:
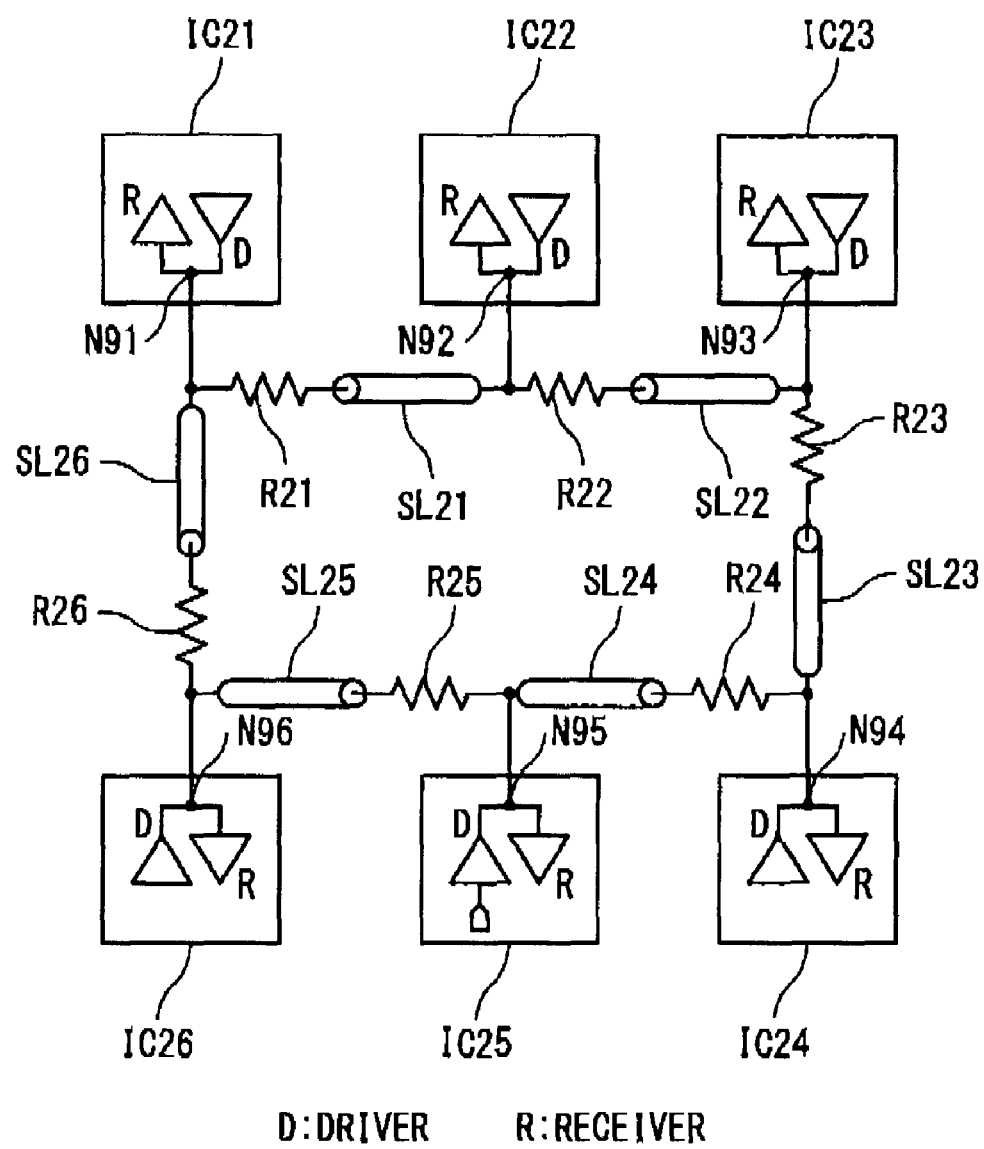
FIG. 3 is a circuit diagram showing a transmission circuit in a related art 1.
Figure 4:
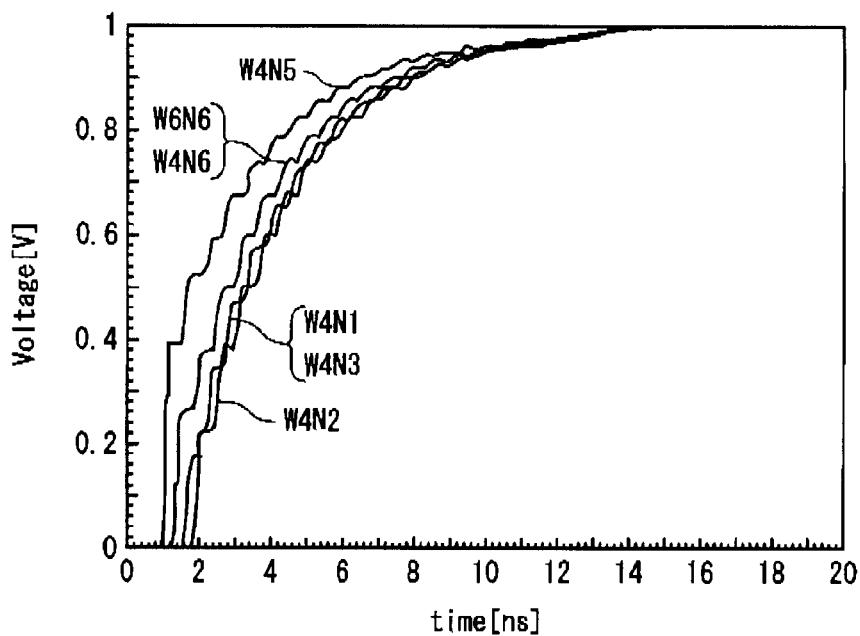
FIG. 4 is a transmission property graph of the transmission circuit in the related art 1.

The configuration of discovering the condition to solve the problems in the transmission impedance of the ring-shaped transmission circuit and the output impedance of the driver will be described below. In the conventional technique, when they are viewed from the device DEV5 shown in FIG. 3, the two paths are different in the equivalent impedance viewed from the device DEV5.

At first, the anticlockwise path oriented in the direction of the transmission line T45 and the resistor R45 seems to be 50Ω equivalently, because the transmission line is forwardly located. On the other hand, the clockwise path oriented in the direction of the resistor R56 and the transmission line T56 seems to be 100Ω equivalently, because the resistor is forwardly located. In short, irrespectively of the impedance of 50Ω of the driver in the device DEV5, the synthesized equivalent impedance viewed from the connection node N95 is about 33.3Ω, which results in the mismatching.

In the first embodiment of the present invention, the matching when it is viewed from the device DEV1 shown in FIG. 8 is attained. That is, the output impedance of the driver of the device DEV1 is 25Ω. On the contrary, the transmission line impedance is 50Ω in the transmission line T12 and the transmission line T31 that are connected through the transmission line T1. Here, when the transmission line T12 and the transmission line T31 are viewed from the transmission line T1, both of the transmission lines are connected in parallel. Thus, the equivalent impedance for the transmission lines is 25Ω, which is matched to 25Ω that is the output impedance of the driver.

Finally, the configuration of discovering the condition to solve the problem in the relation between "the rising/falling time of the output signal" and "the overlapping timing between the clockwise waveform and the anticlockwise waveform" will be described below.

As described in the first embodiment of the present invention, "the temporal difference between the clockwise transmission delay and the anticlockwise transmission delay" is set to be shorter than "the rising time of the waveform". This fact provides the waveform in which the shelf is not generated due to reflection through the synthesis of the clockwise direction waveform and the anticlockwise direction waveform.

Second Embodiment

Figure 12:
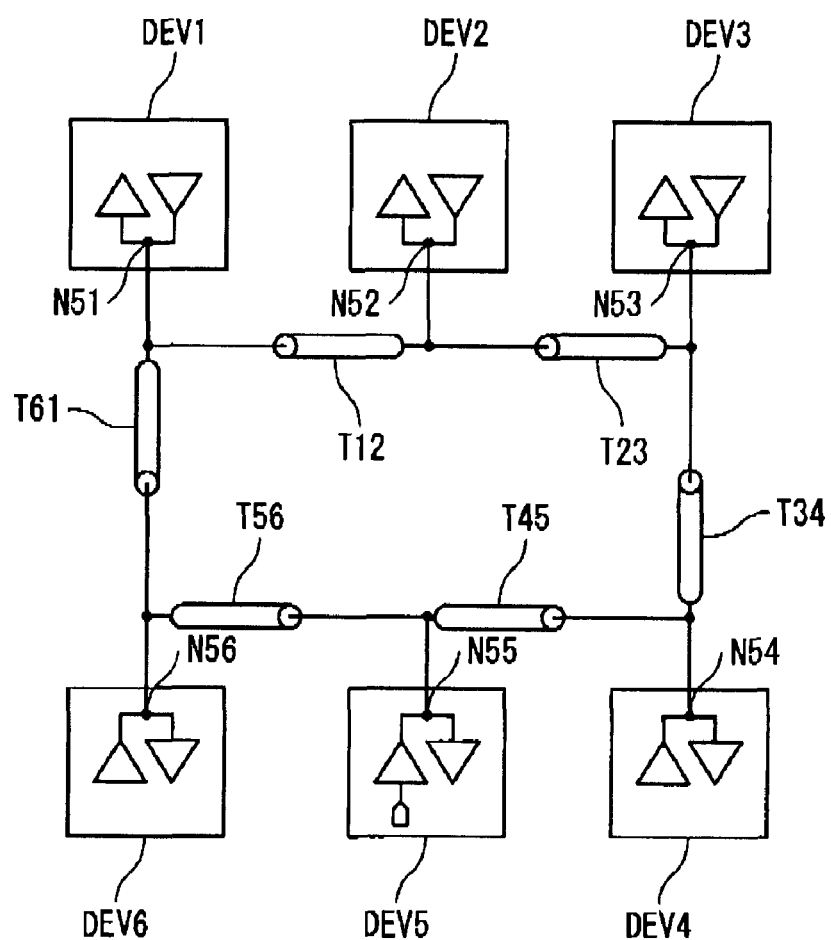
FIG. 12 is a circuit diagram showing a transmission circuit according to a second embodiment of the present invention.

FIG. 12 is a circuit diagram showing the transmission circuit according to a second embodiment of the present invention. The transmission circuit contains six transmission lines T12, T23, T34, T45, T56 and T61; six devices DEV1, DEV2, DEV3, DEV4, DEV5 and DEV6; and six connection nodes N51, N52, N53, N54, N55 and N56. It should be noted that the numbers of the transmission lines, the devices and the connection nodes are preferred to be equal. However, those numbers are not limited to six.

One of ends of the transmission line T12 is connected to the device DEV2 and one of ends of the transmission line T23 at the connection node N52. The other of the ends of the transmission line T23 is connected to the device DEV3 and one of ends the transmission line T34 at the connection node N53. The other of the ends of the transmission line T34 is connected to the device DEV4 and one of ends of the transmission line T45 at the connection node N54. The other of the ends of the transmission line T45 is connected to the device DEV5 and one of ends of the transmission line T56 at the connection node N55. The other of the ends of the transmission line T56 is connected to the device DEV6 and one of ends of the transmission line T61 at the connection node N56. The other of the ends of the transmission line T61 is connected to the device DEV1 and one of ends of the transmission line T12 at the connection node N51. The six transmission lines T12 to T61 configure the ring-shaped transmission circuit which operates as a bus for connection of the six devices DEV1 to DEV6. All of the impedances of the six transmission lines T12 to T61 are equal.

Each of the six devices DEV1 to DEV6 is a semiconductor integrated circuit in which a driver for outputting a signal and a receiver for receiving a signal are built in. In each of the six devices DEV1 to DEV6, the output impedance of the driver is equal to a half of the impedance of each of the six transmission lines T12 to T61. In each of the six devices DEV1 to DEV6, the rising time and the falling time of the driver are equal. Also, they are equal to a total of the transmission delays of the six transmission lines T12 to T61.

An operation of this transmission circuit in case that the signal is outputted from the driver of the device DEV5 and transmitted to the other five devices DEV1, DEV2, DEV3, DEV4 and DEV6 will be described below.

In the transmission circuit in FIG. 12, the direction in which the signal outputted from the driver of the device 5 is transmitted in an order of the device DEV4, the device DEV3, . . . is referred to as an anticlockwise direction. Similarly, the direction in which it is transmitted in an order of the device DEV6, the device DEV1, . . . is referred to as a clockwise direction.

Figure 13:
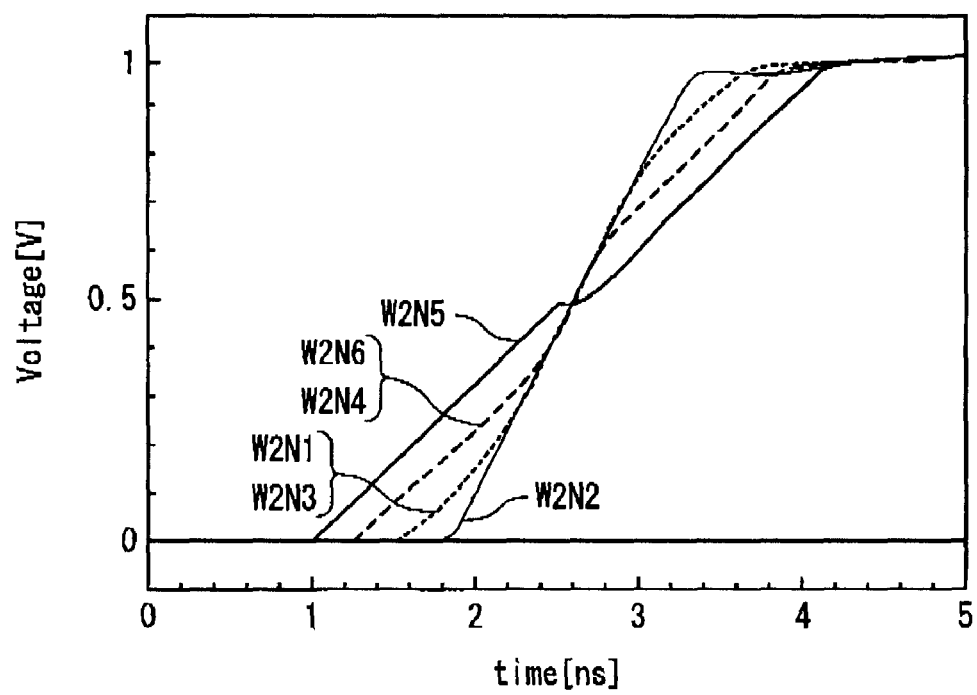
FIG. 13 is a transmission property graph showing an operational property of the transmission circuit according to the second embodiment of the present invention.

FIG. 13 is a transmission property graph showing the operation property of the transmission circuit according to the second embodiment of the present invention. The transmission property graph indicates six waveforms W2N1, W2N2, W2N3, W2N4, W2N5 and W2N6. The six waveforms W2N1, W2N2, W2N3, W2N4, W2N5 and W2N6 correspond to the six connection nodes N51, N52, N53, N54, N55 and N56, respectively. The horizontal axis indicates time. The vertical axis indicates signal voltage of each of the waveforms.

The waveform shown in FIG. 13 is obtained when the circuit constants of components of the transmission circuit shown in FIG. 12 are as follows. That is, in each of the six transmission lines T12 and T23, T34, T45, T56 and T61, a transmission line impedance is 50Ω, and a transmission delay is 250 ps. In each driver of the six devices DEV1, DEV2, DEV3, DEV4, DEV5 and DEV6, an output impedance is 25Ω, and a rising time and a falling time of the signal are 1500 ps. In each of the six devices DEV1, DEV2, DEV3, DEV4, DEV5 and DEV6, a terminal capacitance is 1 pF.

Each of the impedances of the transmission line T45 and the transmission line T56 that are connected to the connection node N55 is 50Ω. Thus, when the transmission line T45 and the transmission line T56 are viewed from the connection node N55, they are connected in parallel, and the equivalent impedance is 25Ω. While the equivalent impedance is 25Ω, the output impedance of the device DEV5 is equally 25Ω. Thus, at the time of the rising, the output level is 0.5 V in which 1 V is divided by resistors.

As mentioned above, the signal waveform W2N5 at the connection node N55 can be described. That is, the signal outputted from the driver of the device DEV5, when beginning to rise from 0 V at a time 1 ns, arrives at the output level 0.5 after the rising time of 1500 ps. The rising signal circulates the ring-shaped transmission circuit in the anticlockwise direction and circulates it in the clockwise direction at the same time and returns to the connection node N55. At this time, while the signal circulates it, the time of 1500 ps elapses. It should be noted that the 1500 ps is a value equal to six times of the delay time of 250 ps corresponding to each transmission line. This value is equal between the anticlockwise and clockwise directions.

Thus, the signal that circulates it in the anticlockwise direction and the signal that circulates it in the clockwise direction overlap with the output signal that is stable at 0.5 V at the connection node N55, after the time of 1500 ps from the output start. In other words, at the connection node N55 after 1500 ps from the output start, the two signals which circulate the transmission circuit from the left and right directions, are synthesized into the output signal that is stable at 0.5 V. As a result, after the additional time of 1500 ps after 1500 ps has elapsed from the output start, the signal voltage at the connection node N55 is increased from 0.5 V to 1.0 V.

However, in the waveform W2N5 in FIG. 13, a shelf is generated near 0.5 V. This is because the terminal capacitances of the devices DEV1, DEV2, DEV3, DEV4 and DEV6 connected to the transmission circuit serve as parasitic elements, which have influence on the transmission line impedance and the transmission line delay (=propagation delay).

As this influence, firstly, the transmission line impedance decreases. In short, at the time of the rising, the output level tends to be decreased from 0.5 V. Also, the transmission delay increases. In short, the value of 1500 ps that is a start time when the waveform of a signal propagated through the clockwise path and the waveform of a signal propagated through the anticlockwise path are synthesized tends to be longer. As a result, the synthesis start of the three signals at the connection node N55 is delayed, which involves the small shelf.

The operations of the devices DEV6, DEV1, DEV2, DEV3 and DEV4 on the receive side of the transmission signal will be described below. However, as the representative of the five devices, the waveform W2N6 at the connection node N56 of the device DEV6 will be described below. Here, a transmission signal has a waveform that the output level at the rising is 0.5 V and the rising time is 1500 ps, as previously described in the rising waveform of the device DEV5.

When the transmission signal is transmitted from the device DEV5 to the device DEV6, the waveform of the signal propagated through the clockwise path whose transmission delay is small is early transmitted, and after that, the waveform of the signal propagated through the anticlockwise path arrives, and this is synthesized with the clockwise waveform.

The transmission delay in the clockwise direction at the connection node 56 is only the transmission delay of the transmission line T56, and rises 250 ps after the signal output start at the connection node 55. The transmission delay in the anticlockwise direction is a total of the transmission delays of the five transmission lines T45, T34, T23, T12 and T61, and it is 1250 ps. It should be noted that 1250 ps is a value equal to five times of 250 ps that is the transmission delay of each transmission line.

In short, at first, after 250 ps from the time when the signal of the connection node N55 begins to rise, the signal waveform at the connection node N56 begins to rise up to 0.5 V in the rising time of 1500 ps. In the course of this rising, after 1250 ps from the time when the signal at the connection node N55 begins to rise, the signal waveform transmitted in the anticlockwise direction is synthesized with the signal waveform at the connection node N56. This synthesis is synthesis of a further signal rising waveform with the signal rising waveform. For this reason, the inclination of the rising waveform from the time of 1250 ps becomes doubled, namely, the inclination is equal to that when the rising time is 750 ps.

As mentioned above, the signal waveform W2N6 has been described. Similarly, the four waveforms W2N1, W2M2, W2N3 and W2N4 in FIG. 13 correspond to the signal waveforms at the four connection nodes N51, N52, N53 and N54 in FIG. 12, respectively.

As mentioned above, the transmission property or propagation property in the transmission circuit in FIG. 12 is as shown in FIG. 13. In this way, the signals respectively received by the five devices DEV6, DEV1, DEV2, DEV3 and DEV4 have the waveforms perfectly equal to each other near 0.5 V which is the logical threshold. That is, the rising are equal to each other.

Until now, the second embodiment of the present invention has been described. The second embodiment is an improvement version of the first embodiment. That is, "the rising/falling time of the output signal is set to the same time as one circle of the ring-shaped transmission circuit". This significance lies in the design for solving a problem generated when the four or more devices are connected to the bus.

A case when the three devices are connected as shown in the first embodiment of the present invention is compared with a case when the four or more devices are connected as similarly shown in the second embodiment. In such comparison, the problem caused by the transmission delay generated when the four or more devices are connected to the bus will be described below.

In FIG. 8 showing the first embodiment, it is considered that the signal is transmitted from the device DEV1 to the two devices DEV2 and DEV3. The transmission delay from the device DEV1 to the device DEV2 is 290 ps that is a total of the transmission delays of the transmission lines T1, T12 and T2. It should be noted that 290 ps is a total of 20 ps of the transmission line T1, 250 ps of the transmission line T12 and 20 ps of the transmission line T2.

The transmission delay from the device DEV1 to the device DEV3 is 290 ps that is a total of the transmission delays of the transmission lines T1, T31 and T3. It should be noted that 290 ps is a total of 20 ps of the transmission line T1, 250 ps of the transmission line T31 and 20 ps of the transmission line T3.

In short, the property is in such a manner that the transmission delays are equal and the transmission waveforms are also equal. When the signal is transmitted from the device DEV2 to the devices DEV3 and DEV1 and a case that the signal is transmitted from the device DEV3 to the devices DEV1, DEV2 are similar. Thus, there is no problem. However, when the four or more devices are connected to the bus, the transmission delays to the counter devices to which the signals are transmitted cannot be made equal. This fact will be specifically described.

In FIG. 12 showing the second embodiment of the present invention, it is considered that the signal is transmitted from the device DEV5 to the five devices DEV1, DEV2, DEV3, DEV4 and DEV6. In this case, the transmission delay from the device DEV5 to the device DEV6 is the transmission delay 250 ps of the transmission line T56. The transmission delay from the device DEV5 to the device DEV1 is 500 ps that is a total of the transmission delays of the transmission lines T56 and T61. It should be noted that 500 ps is a total of 250 ps of the transmission line T56 and 250 ps of the transmission line T61. The transmission delay from the device DEV5 to the device DEV2 is 750 ps that is a total of the transmission delays of the transmission lines T56, T61 and T12. It should be noted that 750 ps is a total of 250 ps of the transmission line T56, 250 ps of the transmission line T61 and 250 ps of the transmission line T12. The transmission delay from the device DEV5 to the device DEV3 is 500 ps that is a total of the transmission delays of the transmission lines T45 and T34. It should be noted that 500 ps is a total of 250 ps of the transmission line T45 and 250 ps of the transmission line T34. The transmission delay from the device DEV5 to the device DEV4 is the transmission delay 250 ps of the transmission line T45.

In short, a problem occurs that the transmission delay is different depending on the device, and a deviation of the transmission delay results in the severe constraint in the high speed transmission.

In order to solve this "problem generated when the four or more devices are connected to the bus", in the second embodiment of the present invention, the rising/falling time of the output signal is set to the same time as one circle of the ring-shaped transmission circuit. Such a setting allows all of the devices to exhibit the same waveform including the timing and the shape between 0.4 V and 0.6 V.

Third Embodiment

Figure 14:
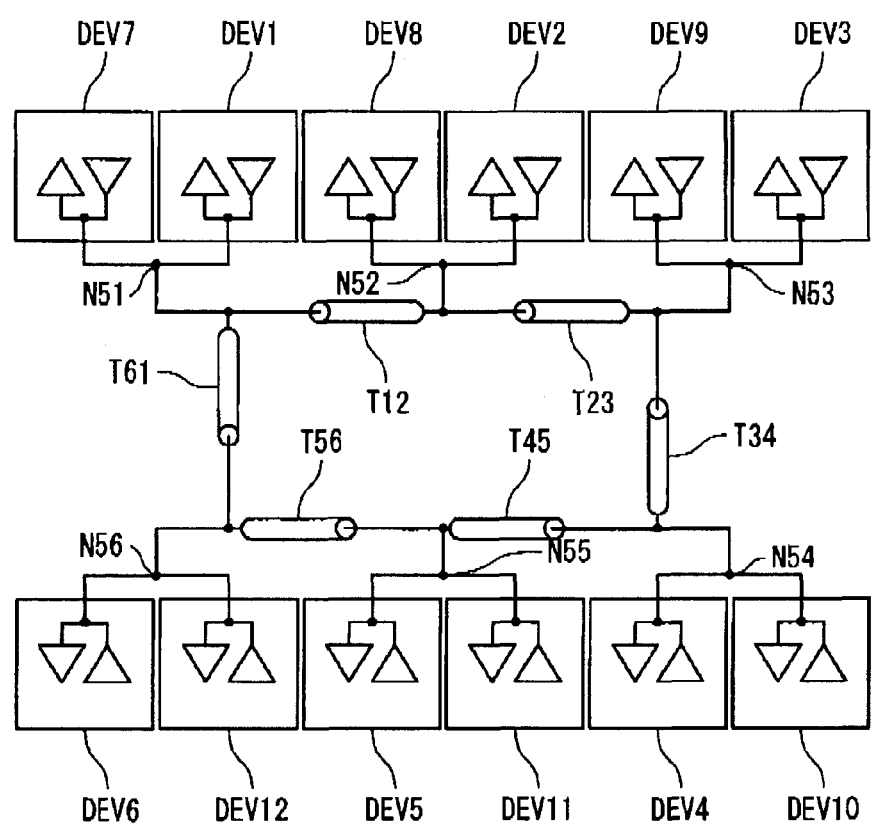
FIG. 14 is a circuit diagram showing a transmission circuit according to a third embodiment of the present invention.

FIG. 14 is a circuit diagram showing a transmission circuit in the third embodiment of the present invention. This transmission circuit is equal to design in which further six devices DEV7, DEV8, DEV9, DEV10, DEV11 and DEV12 are added to the transmission circuit in the second embodiment of the present invention. The six devices DEV7, DEV8, DEV9, DEV10, DEV11 and DEV12 are connected to the six connection nodes N51, N52, N53, N54, N55 and N56, respectively. That is, the two devices are connected to one connection node. It should be noted that the total number of the devices is 12, and the total number of the connection nodes is 6. The total numbers are only one example, and they are not limited to those values.

The other configurations of this transmission circuit are equal to those of the transmission circuit in the second embodiment of the present invention. Thus, their descriptions are omitted. However, the circuit constants necessary for the attainment have influence on the transmission line impedance and the transmission line delay (transmission delay) that are caused by the parasitic capacitance of the device connected to the bus, as described in the second embodiment. Thus, in order to suppress the generation of the shelf caused by the foregoing influence, it is necessary to increase the rising and falling times. Also, the operation and effect of this transmission circuit are same as those of the transmission circuit in the second embodiment of the present invention. Thus, their descriptions are omitted.

Fourth Embodiment

Figure 15:
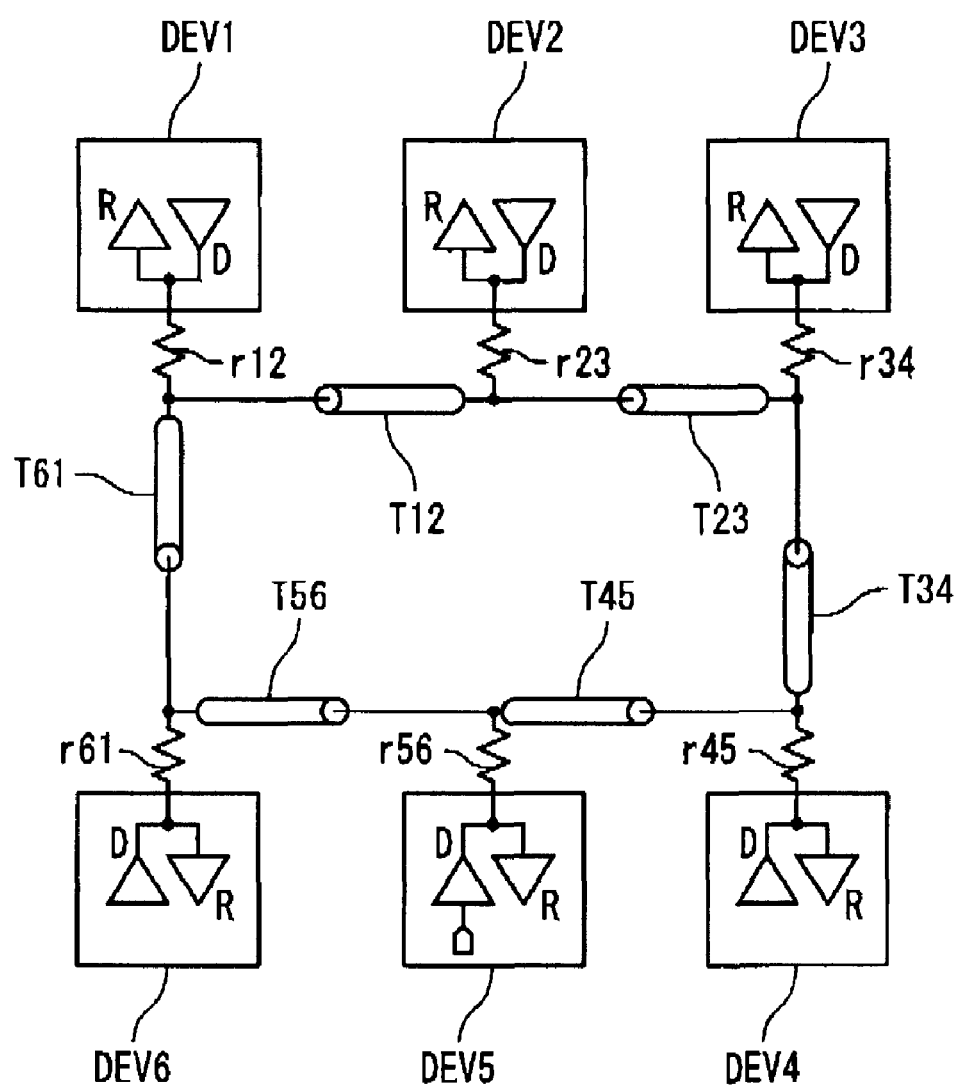
FIG. 15 is a circuit diagram showing a transmission circuit according to a fourth embodiment of the present invention.

FIG. 15 is a circuit diagram showing a transmission circuit in the fourth embodiment of the present invention. In this transmission circuit, six resistors r12, r23, r34, r45, r56 and r61 are added to the transmission circuit in the second embodiment of the present invention. That is, the resistor r23 is connected between the device DEV2 and the connection node N52 through which the two transmission lines T12 and T23 are connected. Similarly, the resistor r34 is connected between the device DEV3 and the connection node N53 through which the two transmission lines T23 and T34 are connected. The resistor r45 is connected between the device DEV4 and the connection node N54 through which the two transmission lines T34 and T45 are connected. The resistor r56 is connected between the device DEV5 and the connection node N55 through which the two transmission lines T45 and T56 are connected. The resistor r61 is connected between the device DEV6 and the connection node N56 through which the two transmission lines T56 and T61 are connected. The resistor r12 is connected between the device DEV1 and the connection node N51 through which the two transmission lines T61 and T12 are connected. Here, all of the resistance values of the six resistors r12, r23, r34, r45, r56 and r61 are equal.

The relation between the resistance values of the respective resistors, the output impedances of the drivers in the respective devices, and the transmission line impedances of the respective transmission lines is as follows. That is, a total of the resistance values of the respective resistors and the output impedances of the driving drivers is equal to or less than a half of the transmission line impedance of the ring-shaped transmission circuit. It should be noted that the total number of the devices is 6, the total number of the connection nodes is 6, the total number of the transmission lines is 6, and the total number of the resistors is 6, they are preferred to be equal. However, this fact is only one example, and the numbers are not limited to those values.

The other components of this transmission circuit are same as those of the transmission circuit in the second embodiment of the present invention. Thus, their descriptions are omitted.

Also, the operation and effect of this transmission circuit are same as those of the transmission circuit in the second embodiment of the present invention. Thus, their descriptions are omitted.

Fifth Embodiment

Figure 16:
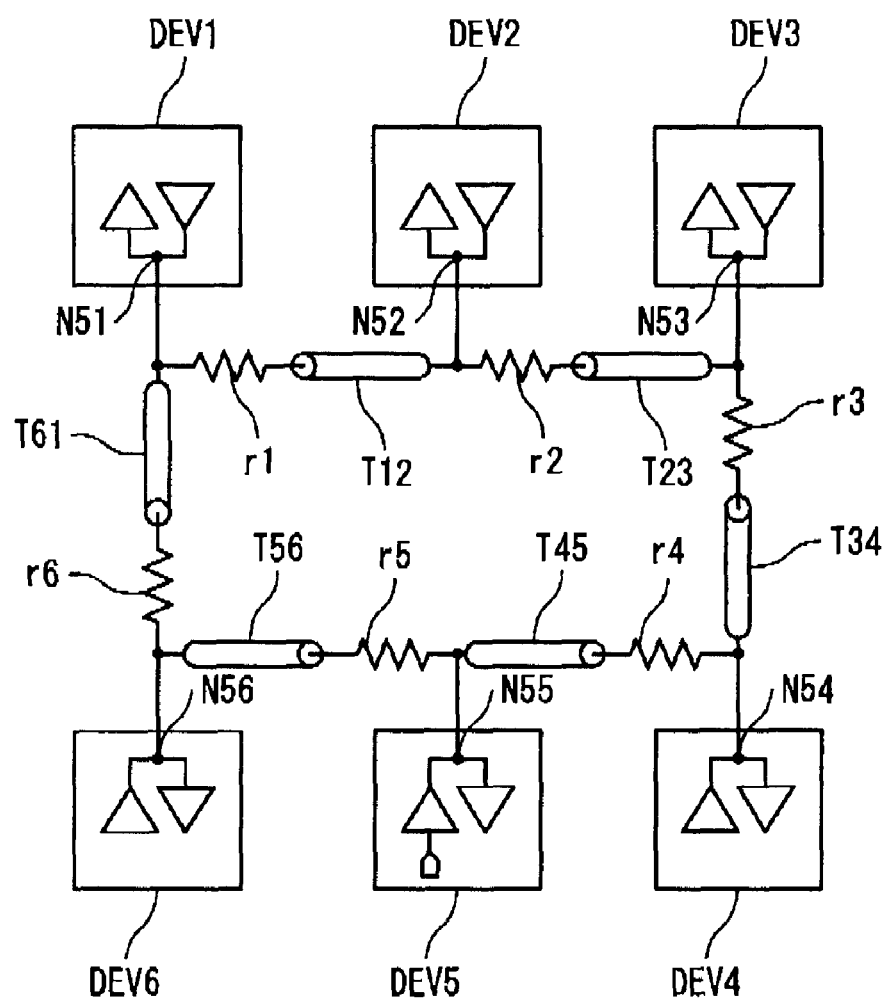
FIG. 16 is a circuit diagram showing a transmission circuit according to a fifth embodiment of the present invention.

FIG. 16 is a circuit diagram showing a transmission circuit according to a fifth embodiment of the present invention. In this circuit, the six resistors r1, r2, r3, r4, r5 and r6 are added to the transmission circuit in the second embodiment of the present invention. In this transmission circuit, the connection node N51, the resistor r1, the transmission line T12, the connection node N52, the resistor r2, the transmission line T23, the connection node N53, the resistor r3, the transmission line T34, the connection node N54, the resistor r4, the transmission line T45, the connection node N55, the resistor r5, the transmission line T56, the connection node N56, the resistor r6 and the transmission line T61 are connected in this order. Moreover, the transmission line T61 is connected to the connection node N51. Consequently, this transmission circuit is loop-shaped. It should be noted that this is same as the transmission circuit already described in FIG. 3 in the conventional technique.

The resistors r1, r2, r3, r4, r5 and r6 are assumed to have the resistance values that are very small, as compared with the transmission line impedance. In short, the resistance values of the resistors r1, r2, r3, r4, r5 and r6 are set to the small resistance values to a degree that the reflections cannot be suppressed or prevented, when being terminated for the transmission line impedances of the transmission lines T12 and T23, T34, T45, T56 and T61.

As an example of a specific value, it is assumed that each of the transmission line impedances of the transmission lines T12 and T23, T34, T45, T56 and T61 is 50Ω, and each of the resistance values of the resistors r1, r2, r3, r4, r5 and r6 is 0.1Ω. It should be noted that in the transmission circuit according to the conventional technique in FIG. 3, the resistance value of each resistor is set to the same value as the transmission line impedance of each transmission line.

Consequently, the mismatching between the clockwise path and the anticlockwise path that is generated in the conventional technique is extremely suppressed. This will be specifically described. In the conventional technique in FIG. 3, the equivalent impedance of each of the connection nodes in the transmission lines that are connected in the shape of the ring is 50Ω in case that "the transmission line is forwardly located and the resistor is backwardly located", and 100Ω in case that "the resistor is forwardly located and the transmission line is backwardly located". In short, the severe mismatching is generated. On the contrary, in this embodiment of the present invention, the equivalent impedance of each of the connection nodes in the transmission lines that are connected in the shape of the ring is 50Ω in case that "the transmission line is forwardly located and the resistor is backwardly located" and 50.1Ω, and in case that "the resistor is forwardly located and the transmission line is backwardly located". In short, the severe mismatching is not generated.

It should be noted that the total number of the devices is 6, the total number of the connection nodes is 6, the total number of the transmission lines is 6, and the total number of the resistors is 6. The numbers are preferred to be equal. However, this is only one example. Thus, the numbers are not limited to those values. The other components of this transmission circuit are the same as those of the transmission circuit in the second embodiment of the present invention. Thus, their descriptions are omitted.

As described in the plurality of embodiments, in the situation in which the difficulty level of the transmission line tuning is made high in association with the advancement of the higher density of the mounting technique, the present invention can change the demerit of its higher density to the merit. It is said that the effective range of the present invention becomes wider, as the transmission line length is shorter.

According to the configuration of the transmission circuit of the present invention, it is possible to suppress the multiple reflections caused due to the mismatching.

Also, it is possible to configure the system in which the matching between the transmission impedance of the ring-shaped transmission circuit and the output impedance of the driver is attained.

Moreover, the distortion is not generated in the waveform in which "the rising/falling time of the output signal" and "the overlapping timing of the clockwise waveform and the anti-clockwise waveform" of the signal transmitted through the transmission line overlap with each other.

The plurality of embodiments described until now can be freely combined within the range in which any technical conflict does not exist.

Although the present invention has been described above in connection with several embodiments thereof, it would be apparent to those skilled, in the art that those embodiments are provided solely for illustrating the present invention, and should not be relied upon to construe the appended claims in a limiting sense.

What is claimed is:

1. A transmission circuit comprising:
   a plurality of transmission lines connected in a ring to propagate signals among a plurality of devices,
   wherein said plurality of transmission lines each have a predetermined same propagation delay, and a predetermined transmission line impedance,
   the predetermined transmission line impedance is a half or less of an output impedance of each of said plurality of devices, and
   wherein a total value of the propagation delay over said plurality of transmission lines is equal to or less than a rising time or a falling time of a signal outputted from a first optional device of said plurality of devices.

2. The transmission circuit according to claim 1, wherein said plurality of transmission lines are three transmission lines, and
   a time difference between a first propagation delay when the signal is propagated on said plurality of transmission lines in one of a clockwise direction and an anticlockwise direction from said first optional device to another of said plurality of devices, and a second propagation delay when the signal is propagated on said plurality of transmission lines in the other of the clockwise direction and the anticlockwise direction from said first optional device to said another device is equal to or less than a rising time or a falling time of the signal outputted from said plurality of devices.

3. The transmission circuit according to claim 1, wherein said plurality of transmission lines are four transmission lines.

4. The transmission circuit according to claim 1, where two or more of said plurality of devices are connected to a node between two of said plurality of transmission lines.

5. The transmission circuit according to claim 1, further comprising:
   a plurality of resistances having a predetermined same resistance value,
   wherein said plurality of devices are connected with said plurality of transmission lines via said plurality of resistances, respectively, and
   a total of the predetermined resistance value and the output impedance of each of said plurality of devices is a half or less of the transmission line impedance of each of said plurality of transmission lines.

6. The transmission circuit according to claim 1, further comprising:
   a plurality of resistances having a predetermined same resistance value,
   wherein said plurality of transmission lines are connected in a ring through said plurality of resistances, and
   the predetermined resistance value is small to extent that a reflection cannot be suppressed, when said transmission circuit is made linear and the linear transmission circuit is terminated by a resistance with the predetermined resistance value.

7. A transmission method in a transmission circuit which comprises a plurality of transmission lines connected in a ring to propagate signals among a plurality of devices, said method comprising:
   sending a signal from a first optional one of said plurality of devices to said transmission circuit;
   propagating the signal in said transmission circuit; and
   supplying the signal to said plurality of devices other than said first optional device,
   wherein said supplying comprises:
   making the signal outputted from said first optional device exceed a predetermined threshold of a signal voltage at a same time in said plurality of devices other than said first optional device, and
   wherein a total value of the propagation delay over said plurality of transmission lines is equal to or less than a rising time or a falling time of the signal outputted from said first optional device.

8. The transmission method according to claim 7, wherein said plurality of transmission lines are three transmission lines, and
   said propagating comprises:
   propagating the signal with a first propagation delay on said transmission circuit in one of a clockwise direction and an anticlockwise direction from said first optional device to another of said plurality of devices; and
   propagating the signal with a second propagation delay on said transmission circuit in the other of the clockwise direction and the anticlockwise direction from said first optional device to said another device, and
   a time difference between the first propagation delay and the second propagation delay is equal to or less than a rising time or a falling time of a signal outputted from said plurality of devices.

9. The transmission method according to claim 7, wherein said plurality of transmission lines are four transmission lines, and
   said propagating comprises:
   propagating the signal around said transmission circuit to said first optional device,
   wherein a propagation delay to take for said signal to propagate around said transmission circuit is equal to or less than a rising time or a falling time of a signal outputted from said plurality of devices.

10. The transmission method according to claim 7, wherein said supplying comprises:
    propagating the signal to two or more of said plurality of devices which are connected to a node between two of said plurality of transmission lines.

11. The transmission method according to claim 7, wherein said supplying comprises:
    propagating the signal to said plurality of devices through a plurality of resistances between said plurality of transmission lines and said plurality of devices,
    a resistance value of each of said plurality of resistances is a predetermined same value, and when the resistance value is small to an extent that any reflection cannot be prevented, when said transmission circuit is extended as a line and is terminated with a resistor with the resistance value.

12. The transmission method according to claim 7, wherein said propagating comprises:

propagating the signal through a plurality of resistors which are provided between said plurality of transmission lines, a resistance value of each of said plurality of resistances is a predetermined same value, and when the resistance value is small to an extent that any reflection cannot be prevented, when said transmission circuit is extended as a line and is terminated with a resistor with the resistance value.

13. The transmission circuit according to claim 1, wherein when the signal outputted from said first optional device is propagated to said plurality of devices other than said first optional device, the signal outputted from said first optional device exceeds a predetermined threshold of a signal voltage at a same time.

* * * * *